US007952689B2

(12) United States Patent
Kostamovaara et al.

(10) Patent No.: US 7,952,689 B2
(45) Date of Patent: May 31, 2011

(54) METHOD AND ARRANGEMENT FOR PERFORMING TRIGGERING AND TIMING OF TRIGGERING

(75) Inventors: Juha Kostamovaara, Oulu (FI); Pasi Palojärvi, Oulu (FI); Jani Pehkonen, Temmes (FI)

(73) Assignee: Oulun Yliopisto, Oulu (FI)

( * ) Notice: Subject to any disclaimer, the term of this patent is extended or adjusted under 35 U.S.C. 154(b) by 1981 days.

(21) Appl. No.: 10/504,113

(22) PCT Filed: Feb. 11, 2003

(86) PCT No.: PCT/FI03/00106
§ 371 (c)(1),
(2), (4) Date: Aug. 10, 2004

(87) PCT Pub. No.: WO03/069779
PCT Pub. Date: Aug. 21, 2003

(65) Prior Publication Data
US 2005/0094238 A1   May 5, 2005

(30) Foreign Application Priority Data

Feb. 12, 2002  (FI) .................................... 20020279

(51) Int. Cl.
*G01C 3/08* (2006.01)
(52) U.S. Cl. ...... 356/5.05; 356/4.01; 356/4.1; 356/5.01; 356/5.1; 356/5.15
(58) Field of Classification Search ................ 356/5.05, 356/3.01–3.15, 4.01–4.1, 5.01–5.15, 6–22
See application file for complete search history.

(56) References Cited

U.S. PATENT DOCUMENTS

| 3,752,582 A * | 8/1973 | Troll et al. ..................... 356/5.1 |
| 4,139,301 A | 2/1979 | Chaborski |
| 4,195,237 A | 3/1980 | Meslener |
| 4,521,107 A * | 6/1985 | Chaborski et al. ........... 356/5.06 |
| 4,849,644 A * | 7/1989 | Mira et al. ................ 250/559.38 |
| 5,912,728 A | 6/1999 | Besesty et al. |
| 5,926,259 A | 7/1999 | Bamberger et al. |
| 5,953,109 A | 9/1999 | Lai et al. |
| 6,803,998 B2 * | 10/2004 | Hunter et al. ................ 356/5.01 |

FOREIGN PATENT DOCUMENTS

| DE | 30 20 996 | 12/1981 |
| JP | 9269373 | 10/1997 |
| JP | 2001082921 | 3/2001 |
| WO | 02/48646 | 6/2002 |

OTHER PUBLICATIONS

English Abstract of WO 02/48646 dated Jun. 20, 2002.
English Abstract of JP 2001082921 dated Mar. 30, 2001.
English Abstract of JP 9269373 dated Oct. 14, 1997.

* cited by examiner

*Primary Examiner* — Thomas H Tarcza
*Assistant Examiner* — Luke D Ratcliffe
(74) *Attorney, Agent, or Firm* — Ladas & Parry LLP

(57) ABSTRACT

The invention relates to a method and an arrangement for performing triggering and for determining a triggering moment. In the solution, a unipolar electrical pulse of a detector (106, 118) is converted between the detector (106, 118) and a first amplifier (108, 120) succeeding the detector into at least one bipolar electrical oscillation. The bipolar electrical oscillation is amplified with at least one amplifier (108, 120) and triggering is performed at a zero level between the extreme values of the bipolar electrical oscillation. In addition, a triggering moment is determined, at which the amplified bipolar electrical oscillation crosses the zero level between its extreme values.

36 Claims, 2 Drawing Sheets

METHOD AND ARRANGEMENT FOR PERFORMING TRIGGERING AND TIMING OF TRIGGERING

FIELD

Figure 1A:
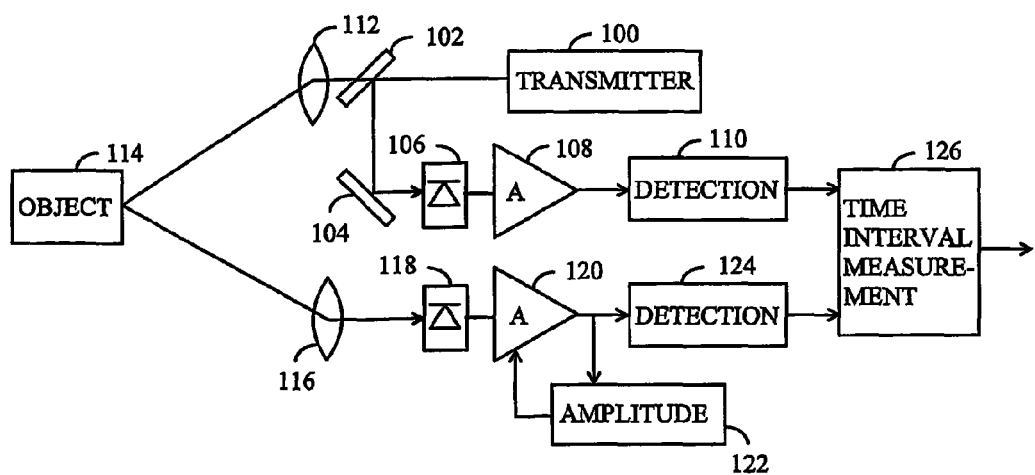

The invention relates to performing the triggering of a unipolar pulse and the timing of the triggering.

BACKGROUND

Triggering from a unipolar pulse in the same way at different pulse amplitude values is important in many technical applications. For example, in a distance measurement technique based on the propagation time of an optical pulse, the time-of-flight of a pulse is determined based on the difference between the transmission and reception moments of the pulse. The timing of the transmission and reception moments is measured by triggering a timing comparator by means of the optical pulse.

The transmission moment is determined by reflecting a small part of the optical pulse to be transmitted, to a detector, which converts the optical pulse into an electrical pulse that is amplified in a preamplifier. For instance in constant threshold detection, the transmission moment is determined as the moment when the leading edge of an amplified electrical pulse exceeds a predetermined triggering level. Other known ways to determine the transmission moment may also be used.

The reception moment is determined in the same way. The radiation reflected from the object to be measured is received with a detector that converts the optical pulse into an electrical pulse, which is amplified in a preamplifier. In this case, too, constant threshold detection can be used to determine the reception moment by determining the moment when the leading edge of the amplified electrical pulse exceeds a predetermined triggering level. However, the problem is that the amplitude of the received pulse usually varies strongly for instance according to the distance and the reflectivity of the reflecting object. The reception moment, in turn, changes as the amplitude of the received pulse changes, i.e. a so-called walk error occurs in the triggering performed in the measurement causing even significant errors in the measurement of the time between the transmitted pulse and the received pulse. A walk error occurs because of the unipolar optical pulse, and, characteristically, the unipolar pulse has no such feature that would enable triggering and timing without walk error.

The CF (Constant Fraction) principle has been used when trying to alleviate the problem, and, at its simplest, can be implemented using a high-pass circuit at the input of the timing comparator. The high-pass circuit converts the unipolar pulse into a bipolar pulse, whose zero crossing point is expressed with the timing comparator. A timing comparator operating according to the CF principle is able to trigger the timing exactly from a pulse in a given dynamic range whose width depends on the acceptable timing error. However, converting a pulse to bipolar does not succeed when the amplitude of an electrical pulse is cut in amplifiers preceding the timing comparator. This is why the CF principle is easily applicable only with automatic gain control (AGC), which keeps the amplitude of the pulse incoming to the timing comparator within a reliable operational range of the timing comparator operating according to the CF principle. However, the problem associated with triggering is not solved this way, but a new problem is created, i.e. that the delay caused to the electrical pulse by the AGC circuits varies according to the amplification of the AGC circuit, i.e. the dynamics are limited in a given measurement error range. The technology is also complicated. In addition, several extra measurement pulses have to be transmitted to the object to determine the amplitude information required as the basis of the control.

A simpler method for timing detection is to operate without automatic gain control. When a timing comparator that detects the edge of a unipolar pulse is used, the amplification of the amplifier succeeding the detector is kept constant irrespective of the amplitude of the input signal. This causes problems. The amplification must be adjusted such that even a small input signal is of sufficient magnitude when applied to the detection block of the timing point. Because of the constant amplification, stronger input pulses grow so large that they are clipped in the amplifiers. Furthermore, the magnitude of the timing error depends on the rate of rise of the pulse, etc. The timing error reaches its peak when one or more amplifiers are saturated. In all, the problem in edge detection is insufficient accuracy.

BRIEF DESCRIPTION

The object of the invention is to provide an improved method and an arrangement implementing the method so that the error made in the triggering remains small.

This is achieved by a method of performing triggering, in which method an optical detector generates a unipolar electrical pulse from an optical pulse detected. The method further comprises: converting the unipolar electrical pulse of the detector, between the detector and a first amplifier succeeding the detector, into at least one bipolar electrical oscillation; amplifying the bipolar electrical oscillation with at least one amplifier; and performing the triggering in a zero level between the extreme values of the bipolar electrical oscillation.

The invention also relates to a method of determining the timing of a pulse, in which method a detector generates a unipolar electrical pulse from an optical pulse detected. The method further comprises: converting the unipolar electrical pulse of the detector, between the detector and a first amplifier succeeding the detector, into at least one bipolar electrical oscillation; amplifying the bipolar electrical oscillation with at least one amplifier; and determining a triggering moment at which the amplified bipolar electrical oscillation crosses a zero level between its extreme values.

The invention further relates to an arrangement for performing triggering, the arrangement comprising an optical detector for generating a unipolar electrical pulse from an optical pulse detected. The arrangement comprises: a converter for converting the unipolar electrical pulse of the detector between the detector and a first amplifier succeeding the detector into at least one bipolar electrical oscillation; at least one amplifier for amplifying the bipolar electrical oscillation; and a trigger for performing triggering in a zero level between the extreme values of the bipolar electrical oscillation.

The invention also relates to an arrangement for determining the timing of a pulse, the arrangement comprising an optical detector for generating a unipolar electrical pulse from an optical pulse detected. The arrangement comprises: a converter for converting the unipolar electrical pulse of the detector between the detector and a first amplifier succeeding the detector into at least one bipolar electrical oscillation; at least one amplifier for amplifying the bipolar electrical oscillation; and means for determining a triggering moment at which the amplified bipolar electrical oscillation crosses a zero level between its extreme values.

The preferred embodiments of the invention are described in the dependent claims.

The invention is based on converting the unipolar pulse into bipolar immediately after the detector, before amplification.

The method and arrangement of the invention provide a plurality of advantages. In triggering, the walk error remains small, which improves the determination of an exact triggering moment. This, in turn, improves the measurement accuracy of the solution presented.

LIST OF THE FIGURES

Figure 1B:
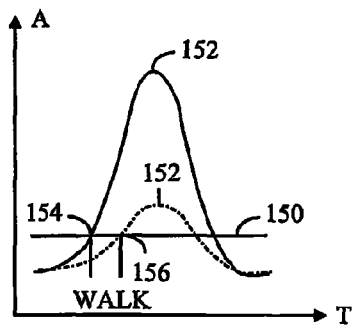
Figure 2A:
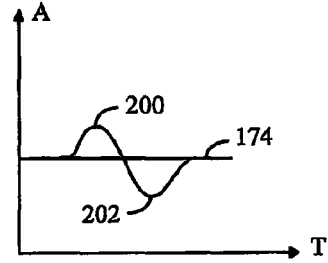
Figure 2B:
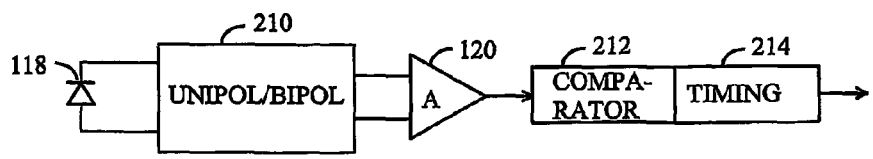
Figure 3A:
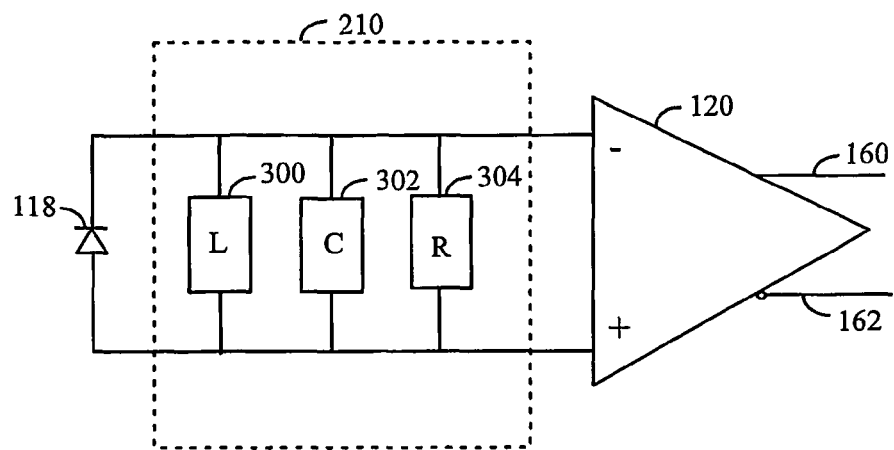
Figure 3B:
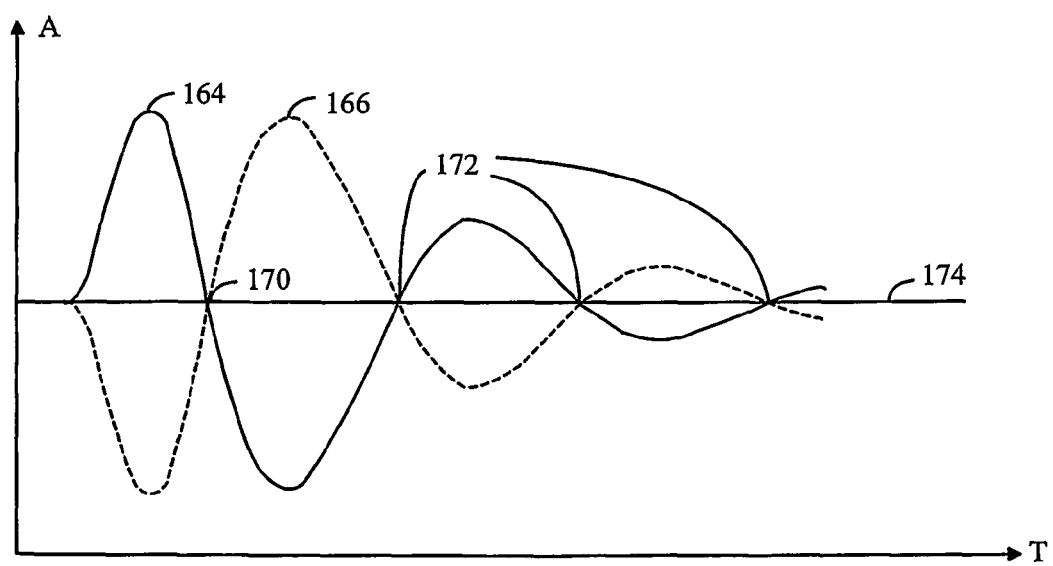

The invention will be described in detail in connection with preferred embodiments with reference to the accompanying drawings, in which FIG. 1A shows a distance measurement device, FIG. 1B shows a walk error, FIG. 2A shows a bipolar pulse, FIG. 2B shows a converter for converting a unipolar pulse into a bipolar pulse, FIG. 3A shows a converter for converting a unipolar pulse into a bipolar pulse, and FIG. 3B shows a triggering performed from a bipolar oscillation.

DESCRIPTION OF THE EMBODIMENTS

The solution presented is applicable for instance in a distance measurement device based on the propagation time of an optical pulse or in nuclear technological measurement devices, without, however, being restricted thereto.

Let us now study a distance measurement device based on the propagation time of an optical pulse by means of FIG. 1. In the present application, optical radiation refers to electromagnetic radiation at wavelengths between 40 nm to 1 mm. The distance measurement device comprises an optical pulse transmitter 100, which may be a laser, led or other device for transmitting optical pulses. The kind of device involved is not essential to the solution presented. The duration of an optical pulse may be for instance some nanoseconds (5 ns to 10 ns), but the solution presented is not either restricted to the duration of the pulse. A pulse transmitted by the transmitter 100 is directed to a detector 106 by using a partially transparent mirror 102 and mirror 104, for example. The detector 106 converts the optical pulse into an electrical unipolar pulse that is amplified in an amplifier 108. The amplified electrical pulse propagates to a timing point detection block 110, which generates an departure mark for the optical pulse. The timing point detection block 110 can generate the departure mark by means of constant threshold detection, the CF principle, edge detection or in accordance with the solution presented.

The optical pulse passes through the partially transparent mirror 102 and propagates to an optical component 112, which comprises for instance lenses for directing optical power to a measurement object 114. The radiation of the optical pulse reflected from the measurement object 114 is received with an optical component 116 comprising lenses, for example. The received pulse is directed from the optical component 116 to a detector 118 for converting the optical pulse into an electrical unipolar pulse, which is amplified in an amplifier 120. If automatic gain control is used, the amplified electrical pulse is coupled to an amplitude measurement block 122, the signal leaving which is used to modify the amplification of the amplifier 120. Although automatic gain control is used in prior art solutions, it is, however, not needed in the solution presented. The amplified electrical pulse propagates further to a timing point detection block 124, which generates an optical pulse reception mark. Both timing point detection blocks 110 and 124 comprise a timing comparator, which is triggered by the pulse applied therein in accordance with the solution presented. When the pulse triggers the timing comparator, the timing comparator generates, at its output, a marking signal that can be further processed in timing detection blocks 110 and 124 for generating a marking signal suitable for digital circuits. The optical pulse departure mark and the optical pulse reception mark are both applied to a time interval measurement block 126, which determines the time lapsed between the departure mark and the reception mark. The measured time, corresponding to the distance between the object 114 to be measured and the measurement device, can be further applied to be processed elsewhere.

In the solution of FIG. 1A, optical pulses are transmitted continuously at the desired frequency. The pulses of the transmission moment and the reception moment are both amplified and a given point is detected from them for use as the triggering moment. It is necessary to distinguish the triggering moment from the signal, because the duration in time of the available optical pulses is often long compared with the desired distance measurement accuracy (pulse duration nanoseconds and measurement accuracy picoseconds). The chain of detector 118, amplifiers 120 and timing detection block 124 is called a laser radar stop channel, the signal output from it being a logics-level pulse including the moment of arrival of the optical pulse. Similarly, on the transmission side, the chain of detector 106, amplifiers 108 and timing detection block 110 is called a laser radar start channel, the signal output from it also being a logics-level pulse including the transmission moment of the optical pulse. The common name amplifier channel can also be used for the start channel and the stop channel. To minimize drift, the transmission moment pulse directly taken from the transmitter 100 is processed by means of an amplifier channel similar to that used in the processing of the pulse received from the measurement object. The time interval measurement block 126 receives these digital marking signals as its input signal and calculates the time difference between them for final determination of the distance measurement result.

FIG. 1B shows a walk error associated with the detection of a pulse edge. The vertical axis shows amplitude A on a freely selected scale and the horizontal axis time t. When the triggering level 150 remains constant, a change in pulse 152 height changes, however, the triggering point and the triggering moment in the pulse. The triggering point 154 of a high unipolar pulse is before the triggering point 156 of a low unipolar pulse.

In the solution presented, the electrical unipolar pulse generated by the detector is converted into a bipolar pulse before pulse amplification (this feature is not shown in FIG. 1A). This principle is applicable both in the transmission channel and in the reception channel. This way the walk error associated with the unipolar pulse and pulse distortion are reduced in the amplifiers in the amplifier channel. FIG. 2A shows a bipolar pulse. The vertical axis shows amplitude A on a freely selected scale and the horizontal axis the time. The bipolar pulse comprises a pulse part 200 obtaining positive amplitude values and a pulse part 202 obtaining negative amplitude values. Line 74 shows the zero level.

Let us now study an embodiment of the solution presented by means of FIG. 2B, which shows the coupling associated with the detector 118 and the amplifier 120 succeeding the first detector more exactly. An important feature of the solution presented is that the electrical unipolar pulse generated by the detector immediately after the detector 118 before the first amplifier 120 is converted in block 210 into a bipolar pulse, i.e. one bipolar oscillation. The zero crossing point of the bipolar pulse acts as the triggering point in a trigger 212, which is a timing comparator and part of a pulse timing determination block 214, and thus the zero crossing point also determines the timing of the reception moment. A unipolar pulse can be converted into bipolar by derivation, which can be implemented by any coupling of passive components, known per se. An example is a simple CR circuit composed of at least one resistor and at least one capacitor. The derivation time constant, composed of the product of the values of the capacitor and the resistor, is a secondary parameter selected via performance optimization on theoretical grounds, by simulation or experiment. Although pulse derivation and a deriving electrical circuit are known per se, the essential point in the solution presented is that the bipolar pulse is generated immediately after the detector before the first amplifier in the amplifier channel. An advantage of this solution is that when the bipolar pulse is generated between the detector 118 and the first amplifier 120, the pulse may later be saturated in the amplifier channel without a significant walk error, since the zero crossing point acting as the triggering and timing moment is close to the zero level, where the zero level of a large and even distorted pulse is in the linear range of the channel. Furthermore, the detector dynamics are usually wider than the amplifier channel and do not restrict the detection. In other words, in a manner of speaking, the pulse shifts to the linear range at the comparator input at the triggering moment.

For the minimization of the walk error, it is advantageous that the amplifiers quickly recover from a clipping situation. This means that the biases are selected so that the transistors of the amplifiers are not saturated under any circumstances. In addition, the amplifier channel has to be as wideband as possible, since the residue walk is proportional to the channel time constant. Because of this, the total amplification required of the amplifier channel should be implemented with several successively coupled stages, which is known to yield the widest possible amplification bandwidth input.

Instead of by derivation, the unipolar pulse can be converted into bipolar also by coupling a resonance circuit to the output poles of the detector, the circuit generating at least one bipolar oscillation. In FIG. 3A, the unipolar pulse is converted into bipolar in block 210, which is a resonance circuit. The simple resonance circuit shown comprises an LC resonator composed of a parallel-coupled coil 300 and capacitor 302. In addition, a shunt resistor 304 is used to attenuate resonance oscillation. The current-mode pulse generated by the detector acts as excitation for the resonance circuit and initiates resonance oscillation. It is advantageous to attenuate resonance oscillation so that the oscillation is attenuated below the interference level in the system before the following pulse. This way the oscillation generated by a previous pulse does not interfere with the measurement performed using the following pulse. Since the resonator is a band-pass-like circuit (for the voltage/current ratio), and thus removes the direct-current component from the detector output signal, the triggering moment required for instance for determining the reception timing of the pulse does not change as the pulse amplitude changes. An advantage in view of derivation with a CR circuit is the better signal-to-noise ratio achieved. This is because small capacitances are advantageously used in a CR coupling for practical reasons, whereby part of the signal stream is shorted via the diode capacitance. The resonator can also be implemented using other passive components, known per se. The resonator can be implemented using a SAW component or a crystal (quartz crystal) or the resonator may also be implemented as an integrated structure instead of separate components. In addition, a correctly dimensioned transmission line may also act as the resonator.

FIG. 3B shows a bipolar oscillation emitted from the output poles 160 and 162 of the amplifier 120. The horizontal axis shows amplitude A on a freely selected scale and the horizontal axis time t. FIG. 3B shows attenuating oscillation. Curve 164 shows oscillation of the output pole 160 and curve 166 shows oscillation of the output pole. Bipolar oscillations are input in one or more successive amplifiers, which increase the oscillation amplitude for the timing comparator. Finally, the timing mark generated in connection with the triggering of the timing comparator is output from the amplifier channel preferably as logics-level. The first triggering moment is the crossing point 170 of the voltage of the positive and negative branch after the initiation of the oscillation.

When a resonance circuit is used, the triggering is independent of the amplitude of the electrical pulse. This is true also of the succeeding voltage crossing points 172, which are also usable as triggering moment marks. In this case, the oscillation is more attenuated and the amplifier more reliably within the linear range of the amplifier channel. The crossing points 170 and 172 are at the zero level 174 between the extreme values of bipolar oscillation. In other words, the first or any zero crossing point can be used for the triggering, whereby the amplitude of the oscillation is also allowed to be cut in the amplifier channel without it affecting the triggering point. The triggering and triggering timing may be more exact when a later zero crossing point is used, since the amplifier channel functions more likely linearly at that particular moment. This eliminates the problems possibly associated with the operation of the amplifiers when the operating voltage of the amplifiers restricts pulse amplification.

The solution presented is thus usable in the reception of a unipolar pulse. The pulse may be for instance electromagnetic or generated by particles. The pulse is converted into a unipolar electrical pulse using a sensor acting as a detector. Particularly for pulse timing, the pulse is converted into bipolar immediately after the detector.

When 5-ns laser diode pulses are used in the solution presented, an about +/−30-ps walk error can be achieved as the amplitude of the received pulse varies in an about 1:3000 dynamic range when the receiver channel is implemented in a 0.8-μm BiCMOS process. The performance improves as the amplifiers speed up, meaning that the walk error of the measurement presented decreases as the technology advances.

Although the invention is described above with reference to examples according to the accompanying drawings, it is apparent that the invention is not limited thereto, but can be modified in a variety of ways within the scope of the inventive idea disclosed in the attached claims.

The invention claimed is:

1. A method of performing triggering, the method comprising
    generating by an optical detector a unipolar electrical pulse from an optical pulse detected;
    derivating the unipolar electrical pulse of the detector, between the detector and a first amplifier succeeding the detector, into at least one bipolar electrical oscillation;
    amplifying the bipolar electrical oscillation with at least one amplifier having a minimized walk error on the basis of a quick recovery from a clipping situation by preventing saturation in transistors by bias selection; and
    performing the triggering in a zero level between the extreme values of the amplified bipolar electrical oscillation.

2. A method of determining the timing of a pulse, the method comprising generating by a detector a unipolar electrical pulse from an optical pulse detected;

derivating the unipolar electrical pulse of the detector, between the detector and a first amplifier succeeding the detector, into at least one bipolar electrical oscillation;

amplifying the bipolar electrical oscillation with at least one amplifier having a minimized walk error on the basis of a quick recovery from a clipping situation by preventing saturation in transistors by bias selection; and determining a triggering moment at which the amplified bipolar electrical oscillation crosses a zero level between its extreme values.

3. A method as claimed in claim 1, the method further comprising removing a direct current component from the bipolar electric pulse when the unipolar electrical pulse is converted into bipolar.

4. A method as claimed in claim 1, the method further comprising converting the unipolar pulse into bipolar by converting the unipolar pulse into a continuous bipolar oscillation.

5. A method as claimed in claim 1, the method further comprising converting the unipolar pulse into bipolar by converting the unipolar pulse into a continuous and attenuating bipolar oscillation in such a way that the oscillation is attenuated below the interference before the following pulse.

6. A method as claimed in claim 1, the method further comprising performing the triggering from the first crossing point of the bipolar pulse over the zero level.

7. A method as claimed in claim 2, the method further comprising determining the triggering moment from the first crossing point of the bipolar pulse over the zero level.

8. A method as claimed in claim 1, the method further comprising performing the triggering from another crossing point than the first crossing point of the bipolar pulse over the zero level.

9. A method as claimed in claim 1, the method further comprising performing the triggering from more than one crossing point of the bipolar pulse over the zero level, and determining the final triggering moment based on the moments of the performed triggerings.

10. A method as claimed in claim 2, the method further comprising determining the triggering moment from another crossing point than the first crossing point of the bipolar pulse over the zero level.

11. A method as claimed in claim 2, the method further comprising determining the triggering moment by means of more than one crossing point of the bipolar pulse over the zero level.

12. A method as claimed in claim 2, the method further comprising
transmitting an optical pulse to an object to be measured at a known moment when the time of flight of the optical pulse is measured;
determining the triggering moment of the pulse reflected and received from the object to be measured; and
determining the time of flight of the optical pulse by means of the transmission moment and the triggering moment of the received pulse.

13. A method as claimed in claim 12, the method further comprising transmitting an optical pulse at a known moment to the object to be measured by determining the triggering moment of the optical pulse to be transmitted.

14. An arrangement for performing triggering, the arrangement comprising
an optical detector for generating a unipolar electrical pulse from an optical pulse detected;
a derivation circuit for converting the unipolar electrical pulse of the detector between the detector and a first amplifier succeeding the detector into at least one bipolar electrical oscillation;
at least one amplifier for amplifying the bipolar electrical oscillation, the at least one amplifier being configured to minimized a walk error by a quick recovery from a clipping situation without saturation in transistors on the basis of bias selection; and
a trigger for performing triggering in a zero level between the extreme values of the amplified bipolar electrical oscillation.

15. An arrangement for determining the timing of a pulse, the arrangement comprising
an optical detector for generating a unipolar electrical pulse from an optical pulse detected;
a derivation circuit for converting the unipolar electrical pulse of the detector between the detector and a first amplifier succeeding the detector into at least one bipolar electrical oscillation;
at least one amplifier for amplifying the bipolar electrical oscillation, the at least one amplifier being configured to minimize a walk error by a quick recovery from a clipping situation without saturation in transistors on the basis of bias selection; and
means for determining a triggering moment at which the amplified bipolar electrical oscillation crosses a zero level between its extreme values.

16. An arrangement as claimed in claim 14, wherein the converter is arranged to remove a direct current component from the bipolar electric pulse when the unipolar electrical pulse is converted into bipolar.

17. An arrangement as claimed in claim 14, wherein the converter is arranged to convert the unipolar pulse into bipolar by converting the unipolar pulse into a continuous bipolar oscillation.

18. An arrangement as claimed in claim 14, wherein the converter is arranged to convert the unipolar pulse into bipolar by converting the unipolar pulse into a continuous and attenuating bipolar oscillation in such a way that the oscillation is attenuated below the interference before the following pulse.

19. An arrangement as claimed in claim 14, wherein the trigger is arranged to trigger from the first crossing point of the bipolar pulse over the zero level.

20. An arrangement as claimed in claim 15, wherein the means for determining a triggering moment are arranged to determine the triggering moment from the first crossing point of the bipolar pulse over the zero level.

21. An arrangement as claimed in claim 14, wherein the trigger is arranged to perform the triggering from another crossing point than the first crossing point of the bipolar pulse over the zero level.

22. An arrangement as claimed in claim 14, wherein the trigger is arranged to perform the triggering from more than one crossing point of the bipolar pulse over the zero level and to determine the final triggering moment based on the moments of the performed triggerings.

23. An arrangement as claimed in claim 15, wherein the means for determining a triggering moment are arranged to determine the triggering moment from another crossing point than the first crossing point of the bipolar pulse over the zero level.

24. An arrangement as claimed in claim 15, wherein the means for determining a triggering moment are arranged to determine the triggering moment by means of more than one crossing point of the bipolar pulse over the zero level.

25. An arrangement as claimed in claim 15, wherein the arrangement is arranged to
  measure the time of flight of the optical pulse and transmit the optical pulse at a known moment to an object to be measured;
  determine the triggering moment of the pulse reflected and received from the object to be measured; and
  determine the time of flight of the optical pulse by means of the transmission moment and the triggering moment of the received pulse.

26. An arrangement as claimed in claim 25, wherein for the determination of the moment of the optical pulse to be transmitted to the object to be measured the arrangement comprises a converter for converting the unipolar electrical pulse of the detector between the detector and a first amplifier succeeding the detector into at least one bipolar electrical oscillation; and means for determining the triggering moment at which the amplified bipolar electrical oscillation crosses the zero level between its extreme values.

27. A method of performing triggering, the method comprising
  generating by an optical detector a unipolar electrical pulse from an optical pulse detected;
  converting, by a resonance circuit, the unipolar electrical pulse of the detector, between the detector and a first amplifier succeeding the detector, into at least one bipolar electrical oscillation;
  amplifying the bipolar electrical oscillation with at least one amplifier having a minimized walk error on the basis of a quick recovery from a clipping situation by preventing saturation in transistors by bias selection; and
  performing the triggering in a zero level between the extreme values of the bipolar electrical oscillation.

28. A method of determining the timing of a pulse, the method comprising generating by a detector a unipolar electrical pulse from an optical pulse detected, characterized by
  converting, by a resonance circuit, the unipolar electrical pulse of the detector, between the detector and a first amplifier succeeding the detector, into at least one bipolar electrical oscillation;
  amplifying the bipolar electrical oscillation with at least one amplifier having a minimized walk error on the basis of a quick recovery from a clipping situation by preventing saturation in transistors by bias selection; and
  determining a triggering moment at which the amplified bipolar electrical oscillation crosses a zero level between its extreme values.

29. An arrangement for performing triggering, the arrangement comprising an optical detector for generating a unipolar electrical pulse from an optical pulse detected;
  a resonance circuit for converting the unipolar electrical pulse of the detector between the detector and a first amplifier succeeding the detector into at least one bipolar electrical oscillation;
  at least one amplifier for amplifying the bipolar electrical oscillation, the at least one amplifier having a minimized walk error on the basis of a quick recovery from a clipping situation by preventing saturation in transistors by bias selection; and
  a trigger for performing triggering in a zero level between the extreme values of the bipolar electrical oscillation.

30. An arrangement for determining the timing of a pulse, the arrangement comprising an optical detector for generating a unipolar electrical pulse from an optical pulse detected;
  a resonance circuit for converting the unipolar electrical pulse of the detector between the detector and a first amplifier succeeding the detector into at least one bipolar electrical oscillation;
  at least one amplifier for amplifying the bipolar electrical oscillation, the at least one amplifier having a minimized walk error on the basis of a quick recovery from a clipping situation by preventing saturation in transistors by bias selection; and
  means for determining a triggering moment at which the amplified bipolar electrical oscillation crosses a zero level between its extreme values.

31. An arrangement as claimed in claim 15, wherein the derivation circuit comprises at least one resistor and at least one capacitor.

32. An arrangement as claimed in claim 31, wherein the derivation circuit comprises at least one resistor and at least one capacitor.

33. An arrangement as claimed in claim 15, wherein the resonance circuit comprises at least one coil and at least one capacitor.

34. An arrangement as claimed in claim 31, wherein the resonance circuit comprises at least one coil and at least one capacitor.

35. An arrangement as claimed in claim 33, wherein the resonance circuit comprises at least one resistor.

36. An arrangement as claimed in claim 34, wherein the resonance circuit comprises at least one resistor.

* * * * *